(12) United States Patent
Abbott

(10) Patent No.: US 7,012,024 B2
(45) Date of Patent: Mar. 14, 2006

(54) METHODS OF FORMING A TRANSISTOR WITH AN INTEGRATED METAL SILICIDE GATE ELECTRODE

(75) Inventor: Todd R. Abbott, Boise, ID (US)

(73) Assignee: Micron Technology, Inc., Boise, ID (US)

(*) Notice: Subject to any disclaimer, the term of this patent is extended or adjusted under 35 U.S.C. 154(b) by 28 days.

(21) Appl. No.: 10/641,851

(22) Filed: Aug. 15, 2003

(65) Prior Publication Data

US 2005/0037584 A1 Feb. 17, 2005

(51) Int. Cl.
*H01L 21/336* (2006.01)

(52) U.S. Cl. ............... 438/682; 438/299; 438/301; 438/305

(58) Field of Classification Search ......... 438/299, 438/301, 303, 305, 682, 310, 758, 764
See application file for complete search history.

(56) References Cited

U.S. PATENT DOCUMENTS

| | | | | |
|---|---|---|---|---|
| 5,923,971 A | * | 7/1999 | Ho et al. .................. 438/245 |
| 6,107,154 A | * | 8/2000 | Lin ............................ 438/396 |
| 6,177,333 B1 | | 1/2001 | Rhodes .................... 438/433 |
| 6,346,477 B1 | * | 2/2002 | Kaloyeros et al. ........ 438/680 |
| 6,362,086 B1 | | 3/2002 | Weimer et al. ........... 438/591 |
| 6,365,452 B1 | * | 4/2002 | Perng et al. .............. 438/241 |
| 6,406,962 B1 | * | 6/2002 | Agnello et al. ........... 438/268 |
| 6,455,906 B1 | | 9/2002 | Chen et al. ............... 257/412 |
| 6,498,062 B1 | * | 12/2002 | Durcan et al. ........... 438/246 |
| 6,541,362 B1 | * | 4/2003 | Forbes et al. ............ 438/596 |
| 6,852,600 B1 | * | 2/2005 | Wang et al. .............. 438/301 |
| 2003/0011018 A1 | * | 1/2003 | Hurley ..................... 257/314 |
| 2003/0077859 A1 | * | 4/2003 | Jeong ...................... 438/241 |
| 2004/0180543 A1 | * | 9/2004 | Lee et al. ................. 438/683 |

FOREIGN PATENT DOCUMENTS

WO PCT/US04/25085 11/2005

* cited by examiner

*Primary Examiner*—Alexander Ghyka
(74) *Attorney, Agent, or Firm*—David J. Paul

(57) ABSTRACT

Methods of forming a transistor having integrated metal silicide transistor gate electrode on a semiconductor assembly are described. The transistor gate is partially fabricated by reacting the metal with epitaxial silicon while residing in a trench to form metal silicide. A transistor gate isolation capping layer is formed in the trench and on the metal silicide. Optional trench spacers can be added to reduce the critical dimension restraints of a given fabrication process and thus form a transistor having smaller feature sizes than the critical dimension.

18 Claims, 14 Drawing Sheets

METHODS OF FORMING A TRANSISTOR WITH AN INTEGRATED METAL SILICIDE GATE ELECTRODE

FIELD OF THE INVENTION

This invention relates to fabrication processes to form semiconductor devices. The invention particularly relates to methods to fabricate a transistor having an integrated metal silicide gate electrode for semiconductor devices.

BACKGROUND OF THE INVENTION

In semiconductor devices, such as a Dynamic Random Access Memory (DRAM) device, the transistor gates are predominantly made of polysilicon and an overlying conductive layer, such as titanium silicide or tungsten silicide. However, tungsten silicide and titanium silicide are larger grain materials that contribute to a rough silicide/silicon interface, which increases the resistance of the transistor gate stack.

Recent semiconductor fabrication methods have been developed to incorporate other types of metal silicide, such as cobalt silicide or nickel silicide, which are smaller grained materials than the titanium silicide or tungsten silicide materials. However, due to the difficulty of etching smaller grained sized metal silicide, these metal suicides can be difficult to incorporate into current fabrication techniques. For example, one technique is demonstrated in prior art FIG. 1–5.

As shown in FIG. 1, layers of material to build a transistor gate stack are formed on silicon substrate 10. First gate oxide 11 is formed, followed in sequence by the formation of polysilicon layer 12, titanium or titanium nitride (Ti/TiN) layer 13, cobalt layer 14, silicon layer 15, nitride layer 16 and finally a pattern photoresist 17.

As shown in FIG. 2, an etch is performed to begin forming the transistor gate stack by patterning nitride 16, silicon 15 and stopping on cobalt layer 14. Silicon 15 is forced to react with cobalt layer 14 where they come into contact with each other to form the cobalt silicide region 30 as seen in FIG. 3. Because this reaction will also occur isotropically (in both the vertical and horizontal directions), cobalt silicide region 30 expands outside the bounds of the original gate stack pattern (defined by nitride 16). As shown in FIGS. 4 and 5, two additional etches are required to complete the transistor gate stack, one wet etch to remove the cobalt material outside the gate stack and one to pattern Ti/TiN layer 13, polysilicon 12 and gate oxide 11. However, the cobalt silicide region 30 will not be affected by the current etch chemistries used to complete the transistor gate stack and thus increases the width of the gate stack.

Therefore, the above method requires several etching steps, increases the critical dimension of the device feature sizes and possibly increases the resistance of the transistor gate stack as the method requires sufficient silicon 15 to ensure that all of the cobalt is converted to cobalt silicide during the reaction step, which in all likelihood results in a small amount of silicon to remain in the gate stack and thus increases the resistance of any contact to this stack.

Currently, in semiconductor fabrication, there is a need for a method to form a metal silicide component of a transistor gate, without increasing the contact resistance or feature size of the device, that will also allow the integration of a transistor gate capping layer that can be used to form the gates of both n-channel and p-channel transistors in semiconductor devices, a need of which is addressed by the following disclosure of the present invention that will become apparent to those skilled in the art.

SUMMARY OF THE INVENTION

Exemplary implementations of the present invention include methods of forming transistors on a semiconductor assembly by forming a transistor having an integrated metal silicide transistor gate electrode on a semiconductor assembly, such as silicon substrate. The transistor gate is partially fabricated by reacting the metal with epitaxial silicon while residing in a trench to form metal silicide. The preferred metal silicide is cobalt silicide or nickel silicide. A transistor gate isolation capping layer is formed in the trench and on the metal silicide. Optional trench spacers can be added to reduce the critical dimension restraints of a given fabrication process and thus form a transistor having a smaller feature size than the critical dimension.

DETAILED DESCRIPTION OF THE INVENTION

The following exemplary implementations are in reference to the formation of n-channel transistors. However, p-channel transistors may be formed in like manner by changing the conductive dopants using techniques well know by those skilled in the art. While the concepts of the present invention are conducive to transistor structures for semiconductor memory devices, the concepts taught herein may be applied to other semiconductor devices that would likewise benefit from the use of the process disclosed herein. Therefore, the depictions of the present invention in reference to transistor structures for semiconductor memory devices are not meant to so limit the extent to which one skilled in the art may apply the concepts taught hereinafter.

In the following description, the terms "wafer" and "substrate" are to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in or over the base semiconductor structure or foundation. In addition, the semiconductor need not be silicon-based, but could be based on silicon-germanium, silicon-on-insulator, silicon-on-saphire, germanium, or gallium arsenide, among others.

Figure 1:
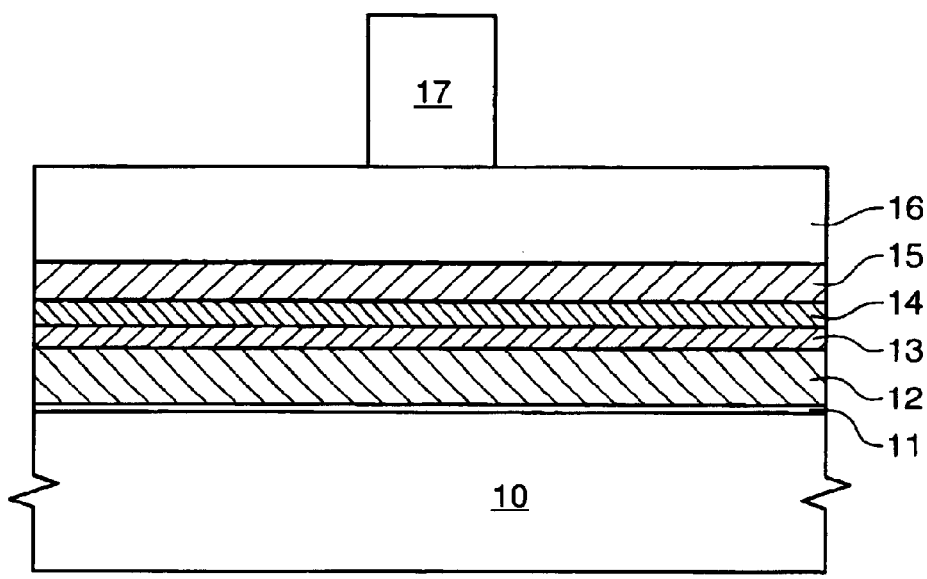
FIG. 1–5 are prior art figures demonstrating a semiconductor fabrication method to form a transistor gate stack comprising cobalt silicide.
Figure 2:
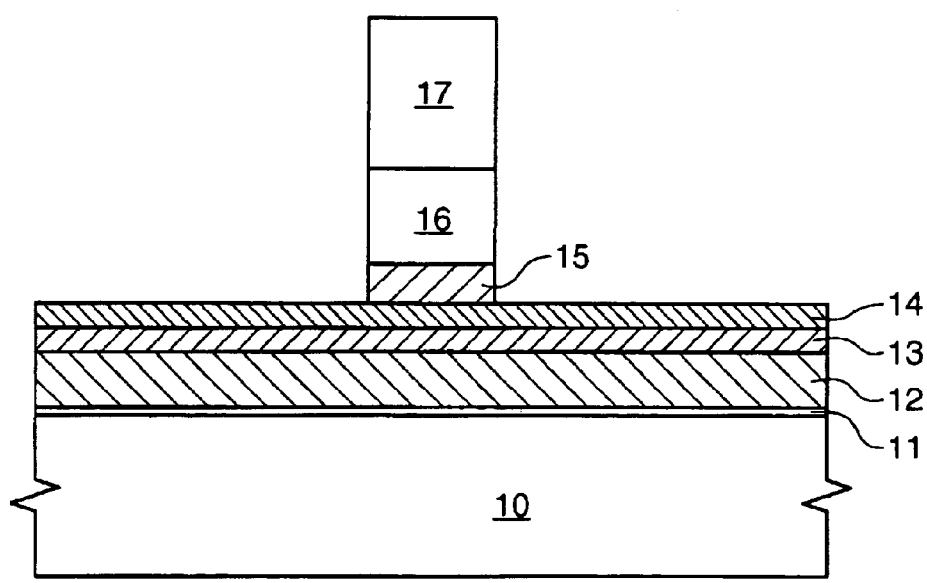
Figure 3:
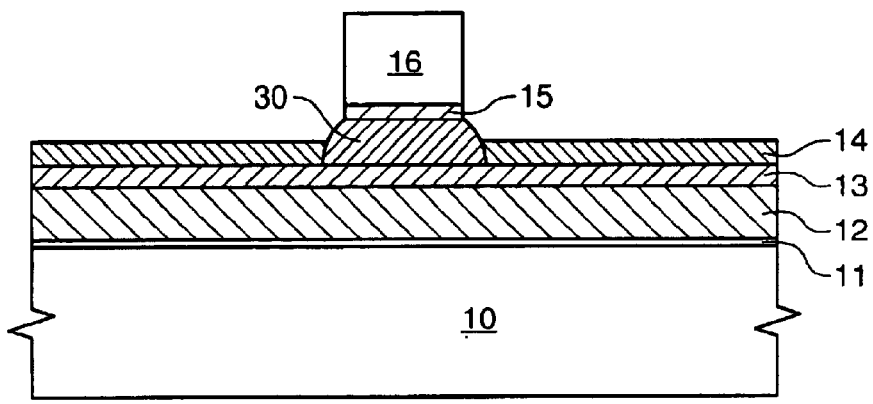
Figure 4:
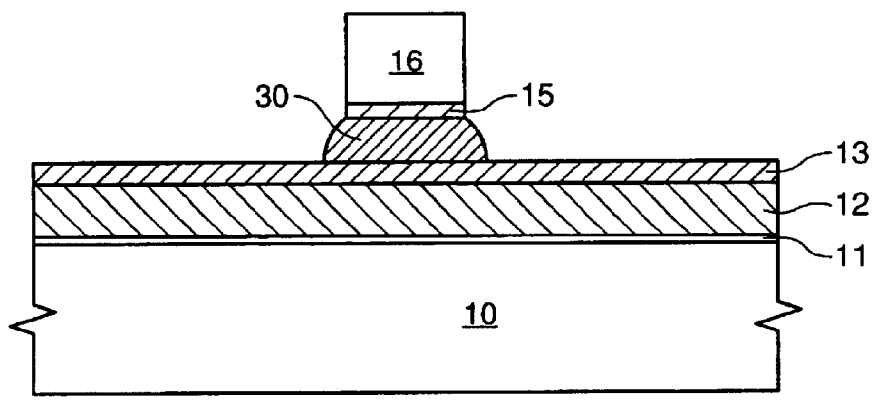
Figure 5:
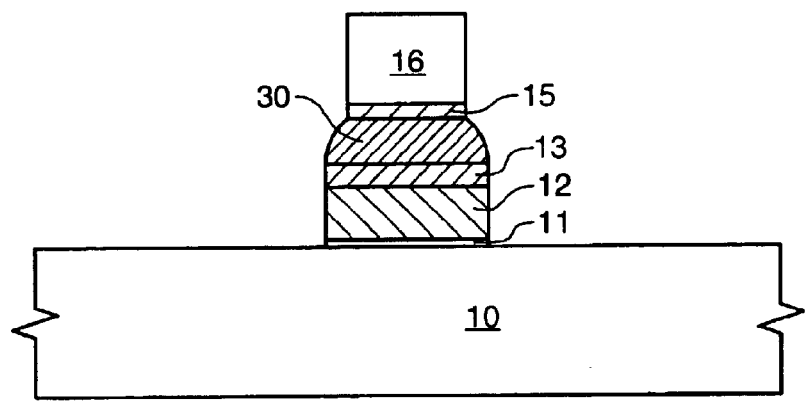
Figure 6:
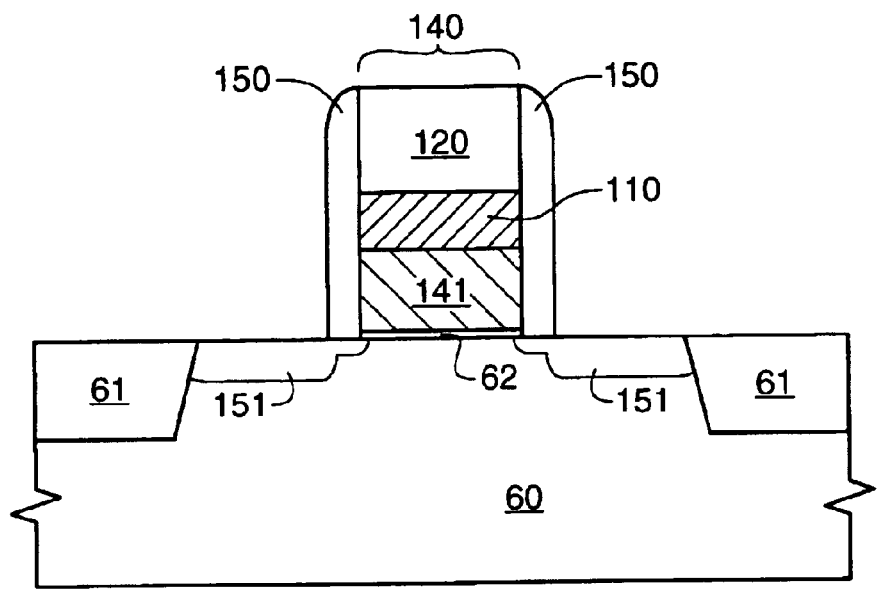
FIG. 6 is a cross-sectional view of a semiconductor substrate section showing an example of one method of the present invention to fabricate a transistor having a metal silicide gate electrode and an integrated isolation capping layer.

FIG. 6 is a cross-sectional view of a semiconductor substrate section showing an example embodiment of a field effect transistor having a metal silicide gate with an integrated isolation transistor cap. As shown in FIG. 6, a semiconductor assembly comprises a p-type conductive silicon substrate 60 into which transistor isolation regions 61 (i.e., trench isolation oxide) are formed. A transistor gate 140, comprises transistor gate isolating capping layer 120 overlying metal silicide section 110, which in turn overlies polysilicon section 141 and that is separated from transistor gate oxide 62. Source/drain regions 151 are formed on opposing sides of transistor gate 140. To complete the transistor gate, transistor gate isolation spacers 150 cover the sidewalls of the transistor gate.

Figure 7:
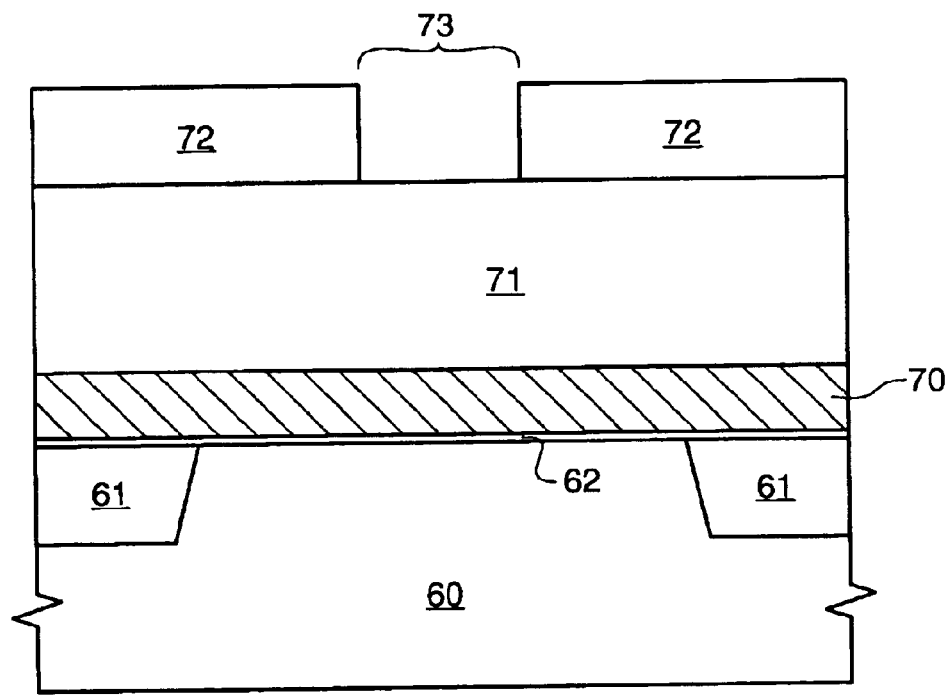
FIG. 7 is a cross-sectional view of a semiconductor substrate section showing the early stages of semiconductor fabrication where the substrate is processed to the point where trench isolation regions are formed into a conductive p-type silicon substrate and an oxide layer is formed thereon. A polysilicon layer is formed on the oxide layer and a trench isolation material is formed over the polysilicon layer. A patterned photoresist is then formed over the trench isolation material, according to a first embodiment of the present invention.

A first method embodiment of the present invention is described with reference to FIGS. 7–16. Referring now to FIG. 7, substrate 60, is processed to the point where trench isolation regions 61 have been formed into a conductive p-type silicon substrate 60. Oxide layer 62, which will eventually become a transistor gate oxide is formed on isolation regions 61 and substrate 60. Next, a polysilicon layer 70 is formed on oxide layer 62 and a trench isolation material 71 is formed over polysilicon layer 70. The trench isolation material may be either silicon dioxide or silicon nitride and in this first example of the present invention silicon dioxide is selected. Photoresist 72 is patterned to provide opening 73, which will allow for a subsequent trench to be etched into underlying trench silicon dioxide 71.

Figure 8:
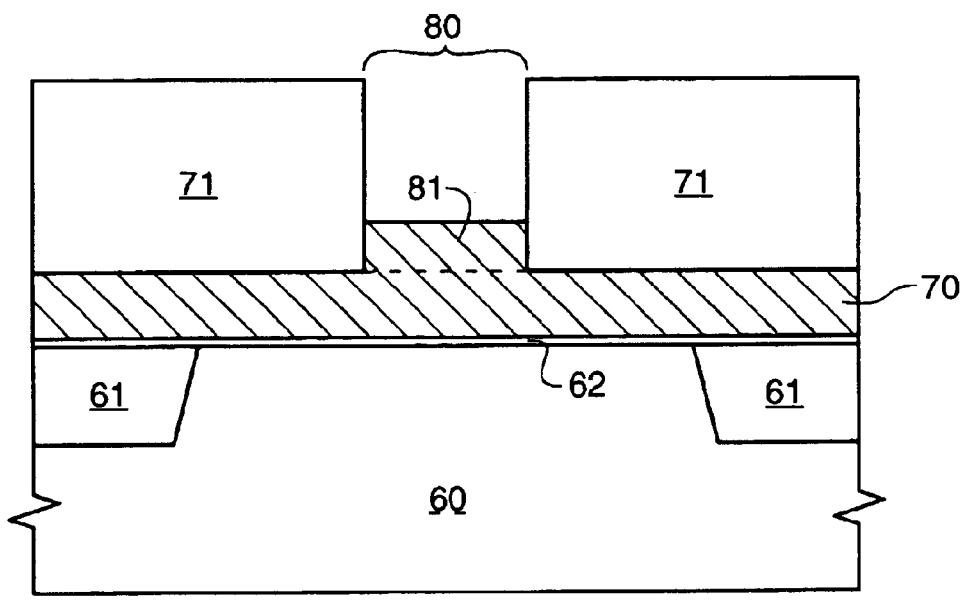
FIG. 8 is a subsequent cross-sectional view taken from FIG. 7 following the etching of a trench into the trench isolation material, followed by growing epitaxial silicon into the bottom of the trench.

Referring now to FIG. 8, trench 80 is etched into trench silicon dioxide 71 until underlying polysilicon layer 70 is exposed. Next, epitaxial silicon 81 (epi-Si) is grown to a thickness of approximately 400–500 Angstroms in the bottom of trench 80 using underlying silicon 70 as a silicon source, by methods know to those skilled in the art. As will become evident in the following process steps, the thickness of epi-Si 81 will depend on the desired thickness of the metal silicide that will be formed. An epitaxial silicon 81 thickness of approximately 400–500 Angstroms represents a preferred embodiment of the present invention.

Figure 9:
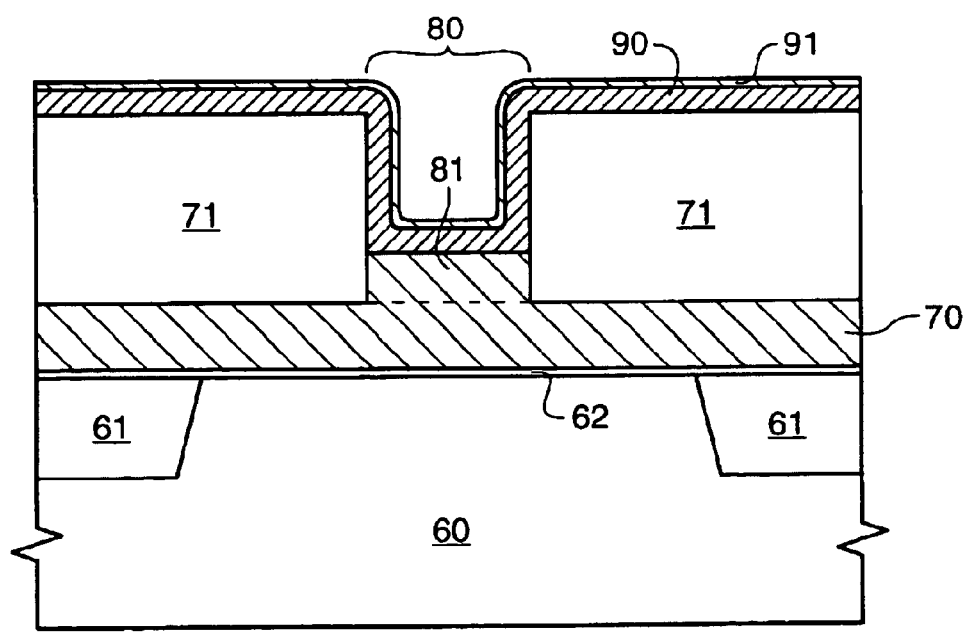
FIG. 9 is a subsequent cross-sectional view taken from FIG. 8 following the deposition of a metal layer on the semiconductor assembly and the deposition of a conductive layer on the metal layer.

Referring now to FIG. 9, a metal layer 90, such as nickel or preferably cobalt, having a thickness of approximately 40–100 Angtroms, is deposited in a conformal manner over the top surface of trench silicon dioxide 71, along the sidewalls of silicon dioxide 71 (in trench 80) and over the top surface of epi-Si 81. In this example of the present invention cobalt is selected for metal layer 90. Following the metal deposition, a conductive layer 91, such as titanium or titanium nitride, having a thickness of approximately 100 Angstroms is deposited in a conformal manner on the metal layer. Metal layer 90 and conductive layer 91 are deposited by methods know to those skilled in the art.

Figure 10:
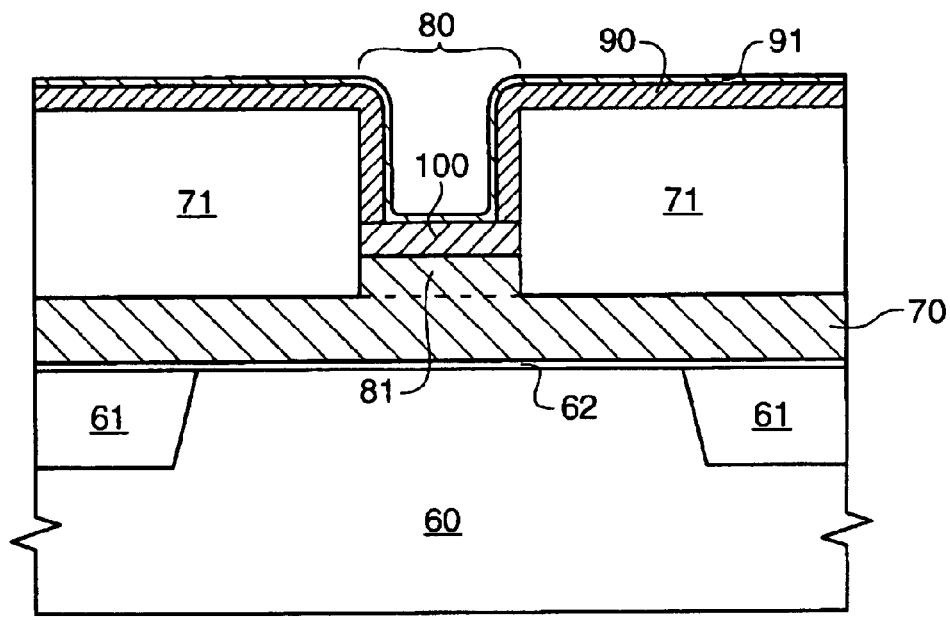
FIG. 10 is a subsequent cross-sectional view taken from FIG. 9 following an anneal step to cause the metal layer to react with the underlying epitaxial silicon to form metal silicide.

Referring now to FIG. 10 and using titanium and cobalt as the preferred example, titanium layer 91 and cobalt layer 90 now overlie epi-Si 81. The semiconductor assembly is subjected to an anneal step and preferably a Rapid Thermal Processing (RTP) step at a temperature range of approximately 500–600° C. for approximately 30 to 60 seconds in order to cause the cobalt to initially react with the epi-Si to form cobalt silicide 100 ($CoSi_x$, where x varies from 1–2). At this point in the process, a portion of epi-Si 81 still remains. Optional titanium layer 91 helps control the eventual CoSi2 grain size and orientation by preventing the underlying cobalt to agglomerate, which is its natural tendency. The titanium essentially functions as a "guiding" layer in the sense that it helps direct CoSi2 grain orientation and size. Thus, the presence of a titanium-based layer (i.e., titanium or titanium nitride) is preferred even though titanium layer 91 is optional and if used will be stripped later in the process.

Figure 11:
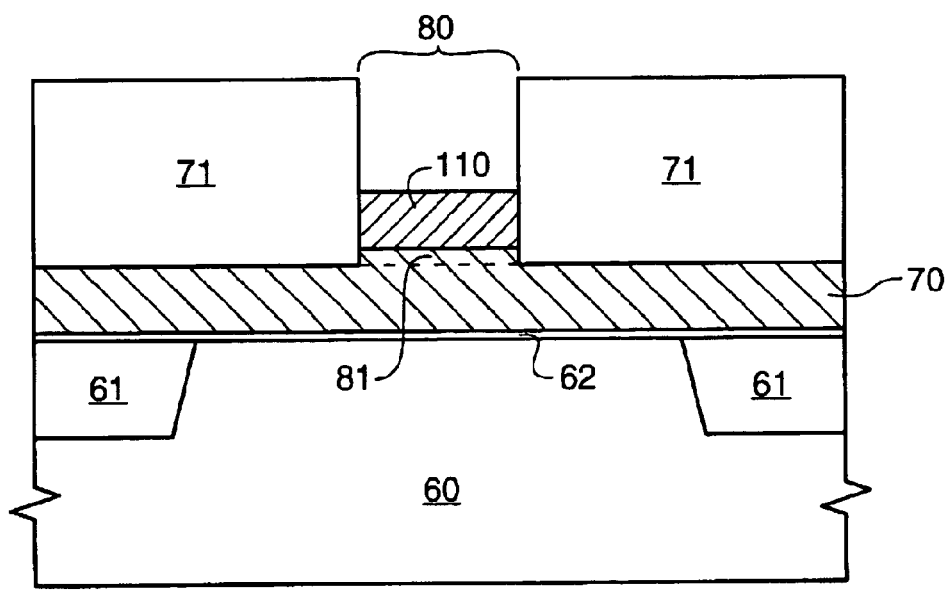
FIG. 11 is a subsequent cross-sectional view taken from FIG. 10 following the removal of any un-reacted metal layer and conductive layer and an optional second anneal step to continue the formation of metal silicide.

Referring now to FIG. 11, once the previous annealing step is completed, the un-reacted portions of cobalt 90 and titanium 91 are stripped from the semiconductor surface by Ammonia Peroxide Mixture (APM) or Hydrochloric Peroxide Mixture (HPM), thus leaving only the $CoSi_x$ 110 and epi-Si 81 remaining in the trench.

The semiconductor assembly may then be subjected to an optional second annealing step, preferably an RTP step at approximately 800–900° C. for approximately 30 to 60 seconds to insure that $CoSi_x$ 100, in contact with epi-Si 81, has indeed reacted with the underlying epi-Si to form an overall $CoSi_2$ layer 110 having a thickness of approximately 100–350 Angstroms. With epi-Si layer 81 having a thickness greater than the desired thickness of $CoSi_2$ layer 110, (which is the case in the present invention) the thickness of cobalt layer 90 determines the overall thickness of $CoSi_2$ layer 110. It is desired that after the formation of $CoSi_2$ layer 110 a portion of epi-Si 81 remains in the bottom of trench 73 and above the original surface of polysilicon layer 70 to ensure that no metal silicide encroaches into underlying polysilicon 70.

If the $CoSi_2$ were allowed to encroach into underlying polysilicon layer 70, as discussed in the prior art, the $CoSi_2$ will also form isotropically (in both the vertical and horizontal directions) and the width of the gate stack will grow outside the width of trench 80, thus causing the feature size of the gate stack to be greater than the critical dimension constraint of the given process. This situation leads to loss of critical dimension control; as the $CoSi_2$ cannot be etched using a typical gate stack etch chemistry.

Figure 12:
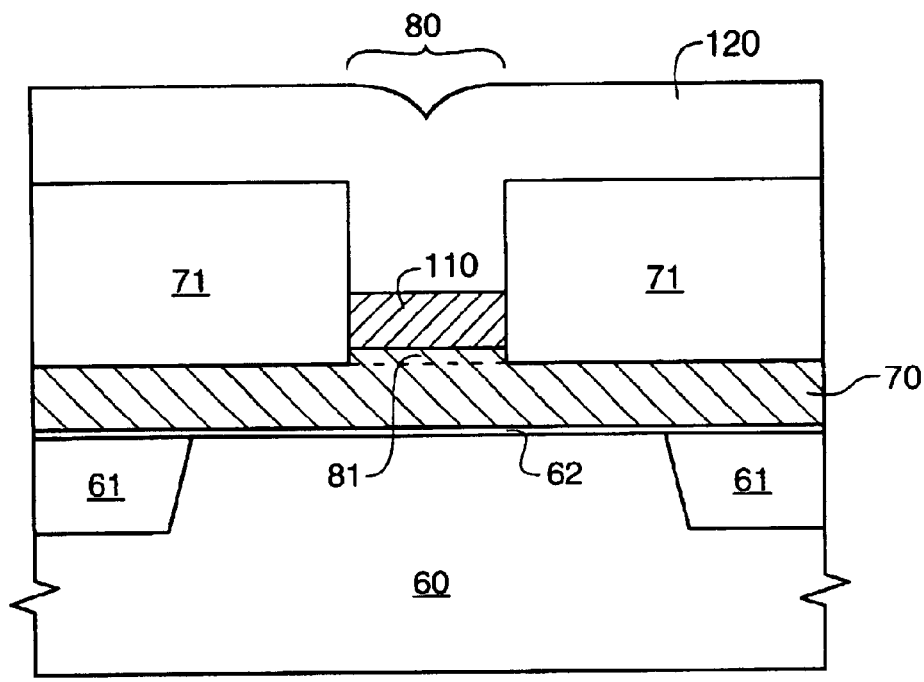
FIG. 12 is a subsequent cross-sectional view taken from FIG. 11 following the deposition of an isolation capping material for a transistor gate.

Referring now to FIG. 12, an isolation cap material 120, such as silicon nitride or silicon dioxide is deposited to completely fill the remaining area of trench 80. The type of isolation material deposited depends on the type of isolation material used for trench formation. In the present example, the trench isolation material used is silicon dioxide, thus the isolation material 120 selected to fill the trench will be silicon nitride, for a reason that becomes apparent in the following step.

Figure 13:
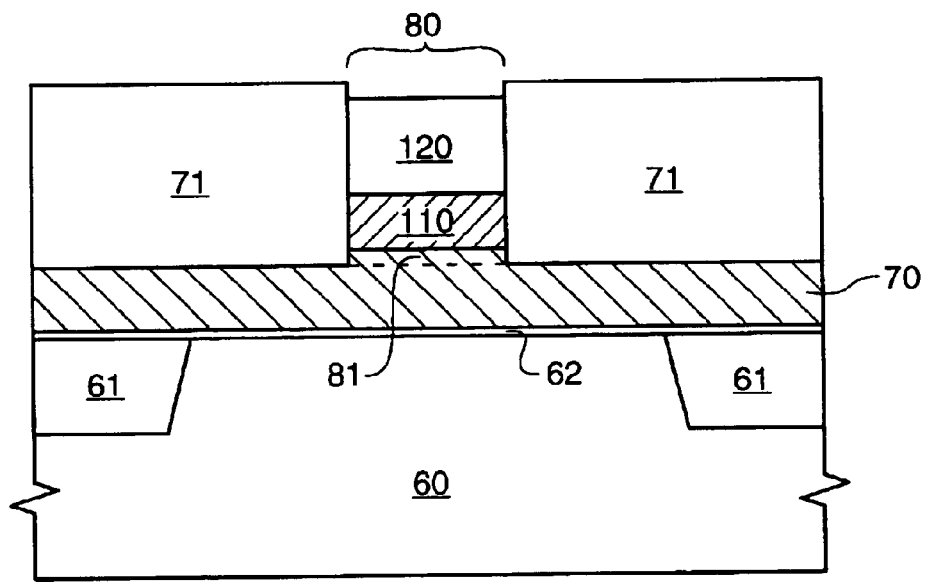
FIG. 13 is a subsequent cross-sectional view taken from FIG. 12 following a selective etch to remove the lateral component of the isolation capping material.

Referring now to FIG. 13, isolation cap material 120 (silicon nitride) is etched back to remove the lateral component thereof, at or below the surface of trench isolation material 71 (silicon dioxide). This etch is selective to silicon dioxide material 71, meaning the etch will stop once it reaches silicon dioxide material 71. For example, a chemical-mechanical planarization etch may be utilized that will stop on silicon dioxide material 71.

Figure 14:
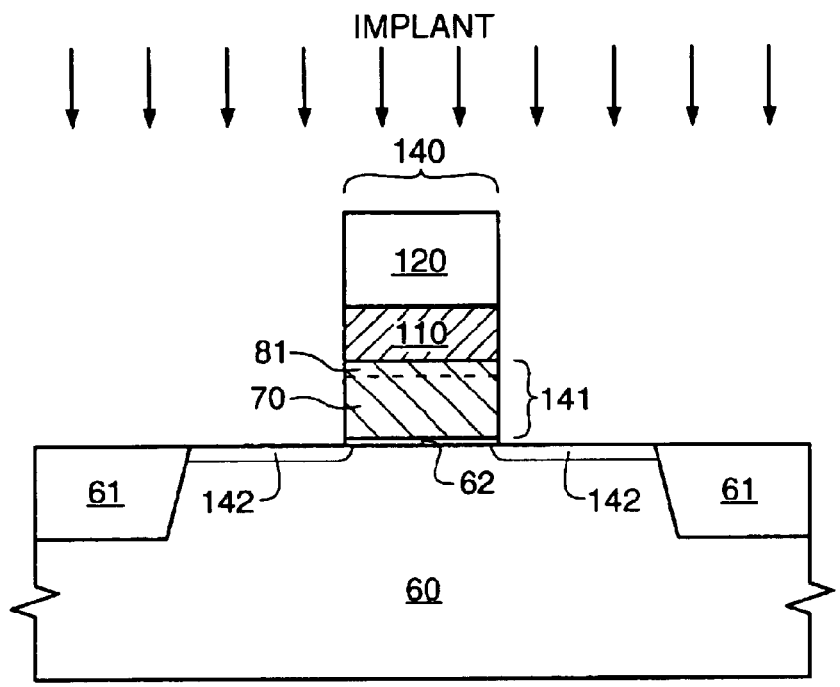
FIG. 14 is a subsequent cross-sectional view taken from FIG. 13 following an etch selective to the isolation capping material to form a transistor gate stack, which is then followed by a self-aligned implant to form lightly doped source/drain regions of the transistor.

Referring now to FIG. 14, an etch selective to isolation cap material 120 is performed that removes isolation trench material 71, the portion of polysilicon layer 70 and the portion of gate oxide layer that underlies isolation trench material 71, to form a transistor gate stack 140. The transistor stack material can be etched using only a dry etch or a combination of a wet etch to remove the trench material, followed by a dry etch to remove the polysilicon and gate oxide. Transistor gate stack 140 comprises gate cap 120, CoSi2 portion 110, epi-Si portion 81 and polysilicon portion 70 (which combine to form silicon portion 141) and gate oxide portion 70. After gate stack 140 is formed, a N-type implant is performed to form lightly doped self-aligned source/drain regions 142.

Figure 15:
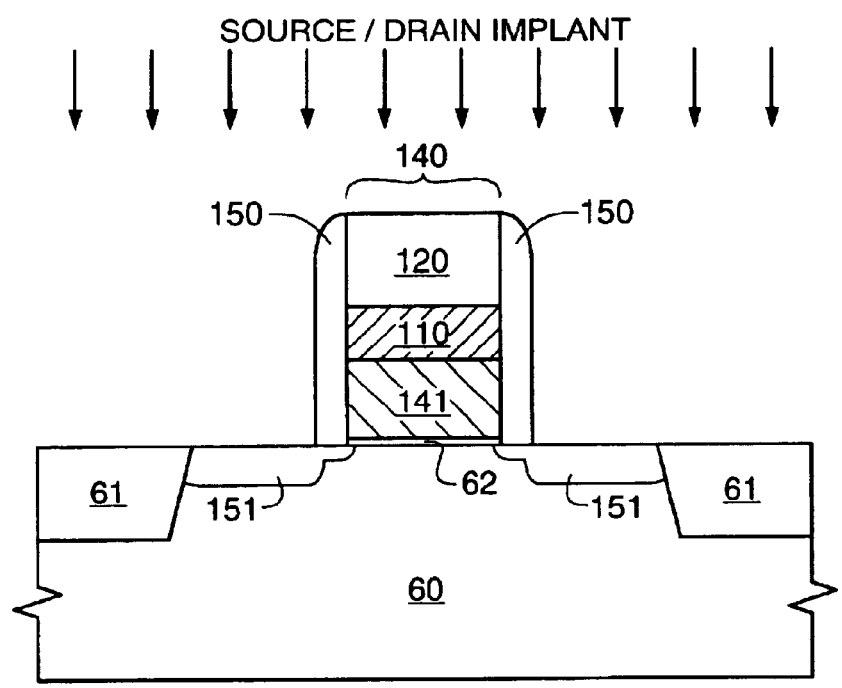
FIG. 15 is a subsequent cross-sectional view taken from FIG. 14 following the formation of transistor gate sidewall isolation spacers and a subsequent source/drain implant.

Referring now to FIG. 15, transistor gate spacers 150 are formed on the sidewalls of gate stack 140. Next, an N-type implant is performed to form source/drain regions 151. The semiconductor assembly is then completed with an appropriate fabrication process know to those skilled in the art.

Figure 16:
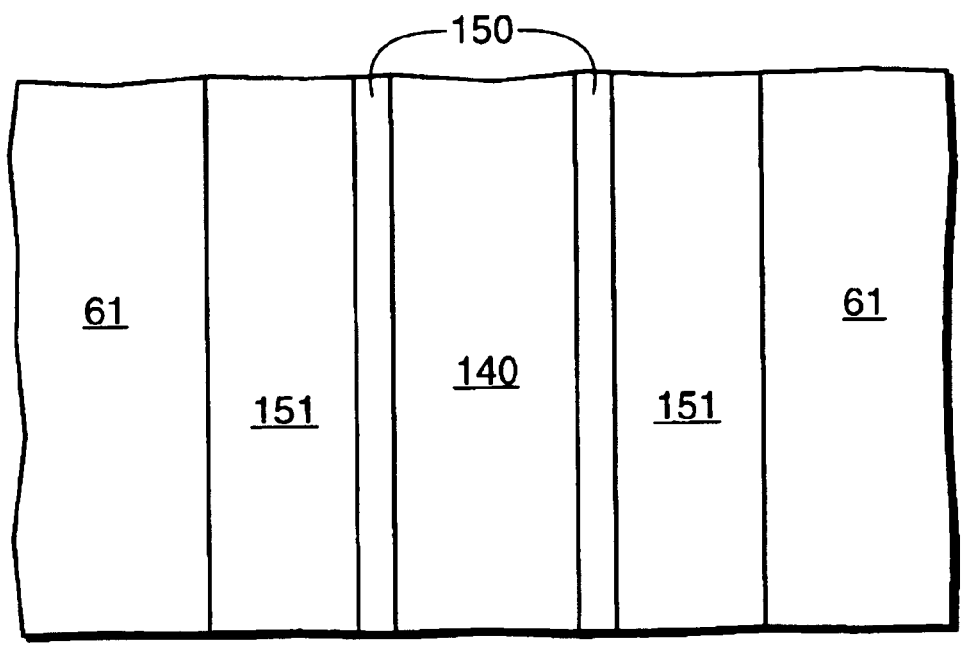
FIG. 16 is an overhead plan view of FIG. 15 showing a completed transistor having a metal silicide gate and an overlying integrated transistor isolation cap as fabricated in the first embodiment of the present invention.

FIG. 16 depicts an overhead view of a completed transistor structure of FIG. 15 showing transistor gate stack 140, transistor gate spacers 150, source drain regions 151 and transistor trench isolation regions 61.

A second method embodiment of the present invention is described with reference to FIGS. 7 and 17–26. Referring now to FIG. 7, substrate 60, is processed to the point where trench isolation regions 61 have been formed into a conductive p-type silicon substrate 60. Oxide layer 62, which will eventually become a transistor gate oxide is formed on isolation regions 61 and substrate 60. Next, a polysilicon layer 70 is formed on oxide layer 62 and a trench isolation material 71 is formed over polysilicon layer 70. The trench isolation material may be either silicon dioxide or silicon nitride and in this second example of the present invention silicon nitride is selected. Photoresist 72 is patterned to provide opening 73, which will allow for a subsequent trench to be etched into underlying trench silicon nitride 71.

Figure 17:
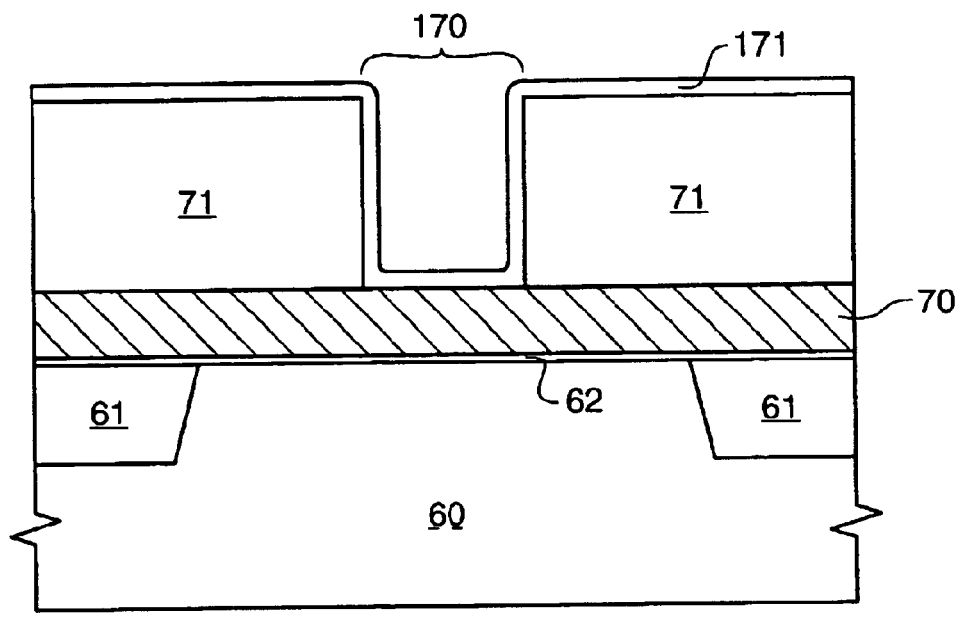
FIG. 17 is a cross-sectional view taken from FIG. 7 following the etching of a trench into the trench isolation material and the deposition of a layer of spacer material on the surface of trench isolation material, along the inner sidewalls of the trench and on the surface of an exposed portion of the underlying polysilicon layer, according to a second embodiment of the present invention.

Referring now to FIG. 17, trench 170 is etched into trench silicon nitride 71 until underlying polysilicon layer 70 is exposed. Next, a conformal layer of isolation material 171 is formed on trench isolation material 71, along the exposed sidewalls of trench isolation material 71 (residing inside trench 170) and on an exposed portion of polysilicon layer 70. It is preferred that isolation material 171 be the same type of dielectric material as trench isolation material 71 so that isolation material 171 can be removed when trench isolation material 71 is selectively etched. In this example, since the trench isolation material selected is silicon nitride, silicon nitride is also used for isolation material 171.

Figure 18:
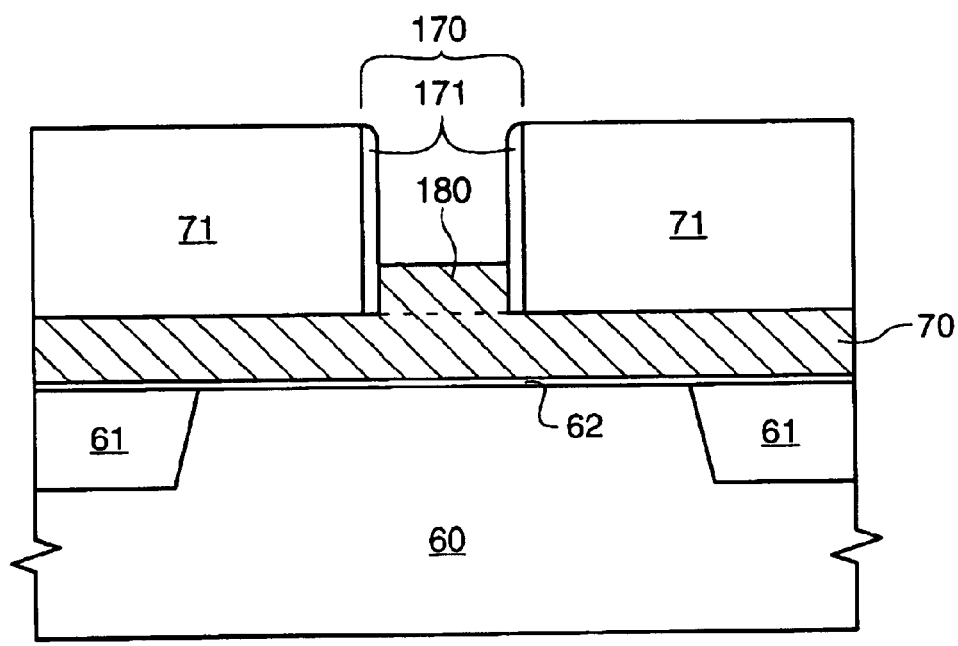
FIG. 18 is a subsequent cross-sectional view taken from FIG. 17 following a spacer etch to form inner spacers on the trench sidewalls, which is followed by growing epitaxial silicon into the bottom of the trench.

Referring now to FIG. 18, a spacer etch is performed to form silicon nitride trench spacers 171 along the sidewalls of trench 170. Next, epitaxial silicon 180 (epi-Si) is grown to a thickness of approximately 400–500 Angstroms in the bottom of trench 170 using underlying polysilicon 70 as a source, by methods know to those skilled in the art. As will become apparent in the later stages of the process, the presence of inner nitride spacers 171 will allow for the fabrication of a transistor with smaller features than can be obtained by the critical dimension restraints of a given process, as well as provide protection for subsequently formed metal silicide.

Figure 19:
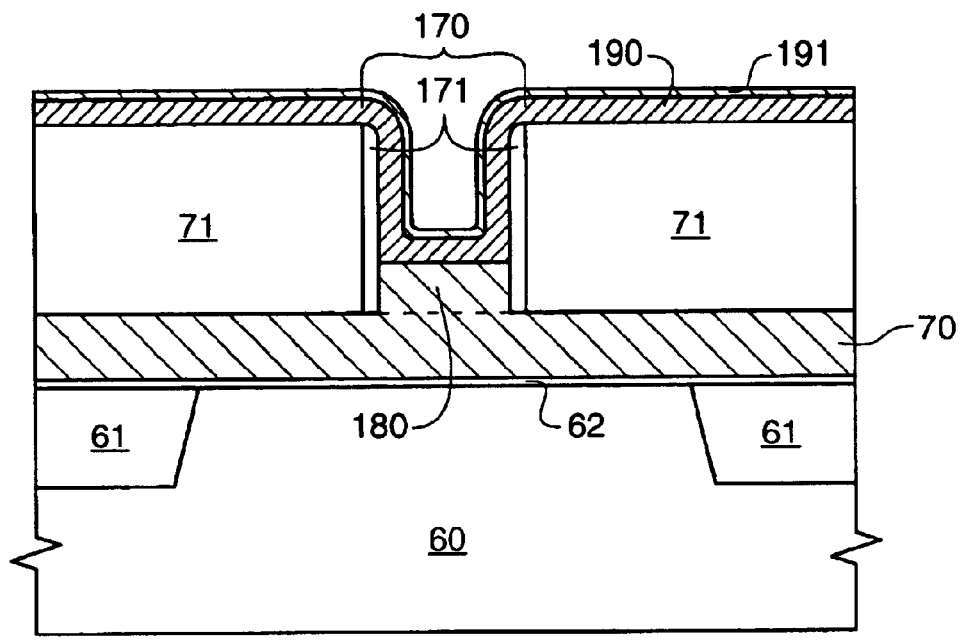
FIG. 19 is a subsequent cross-sectional view taken from FIG. 18 following the deposition of a metal layer on the semiconductor assembly and the deposition of a conductive layer on the metal layer.

Referring now to FIG. 19, a metal layer 190, such as nickel or preferably cobalt, having a thickness of approximately 40–100 Angtroms, is deposited in a conformal manner over the top surface of trench silicon nitride 71, along the trench sidewalls of silicon nitride 71 and over the top surface of epi-Si 180. In this example of the present invention cobalt is selected for metal layer 190. Following the metal deposition, an optional conductive layer 191, such as titanium or titanium nitride, having a thickness of approximately 100 Angstroms is deposited in a conformal manner on metal layer 190. Metal layer 190 and conductive layer 191 are deposited by methods know to those skilled in the art.

Figure 20:
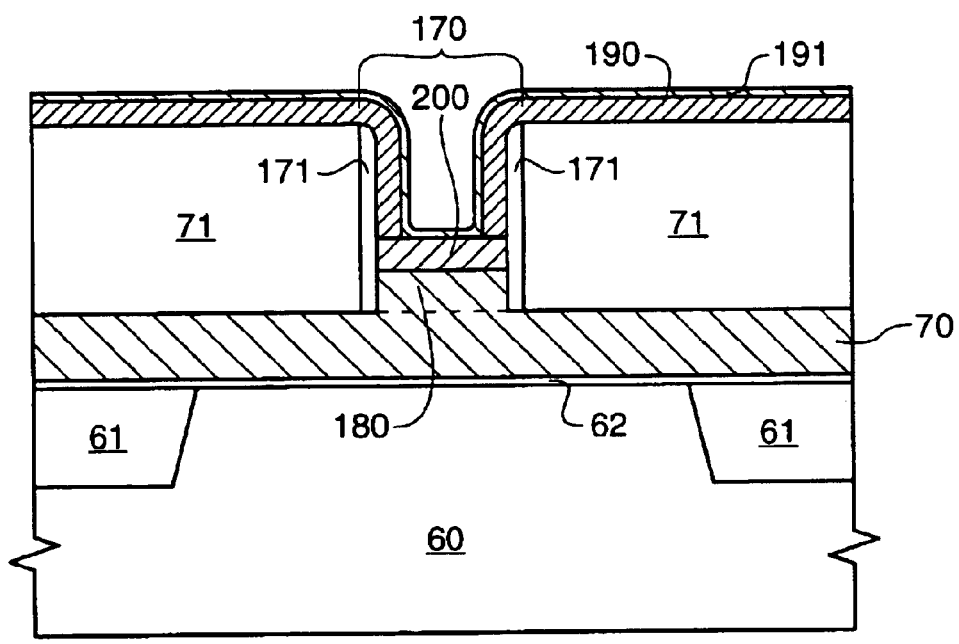
FIG. 20 is a subsequent cross-sectional view taken from FIG. 19 following an anneal step to cause the metal layer to react with the underlying epitaxial silicon to form metal silicide.

Referring now to FIG. 20 and using titanium and cobalt as the preferred example, titanium layer 191 and cobalt layer 190 now overlie epi-Si 180. The semiconductor assembly is subjected to an anneal step and preferably a Rapid Thermal Processing (RTP) step at a temperature range of approximately 500–600° C. for approximately 30 to 60 seconds in order cause the cobalt to initially react with the epi-Si to form cobalt silicide ($CoSi_x$, where x varies from 1–2) 200. At this point in the process, a portion of epi-Si 180 still remains in the bottom of trench 170. Titanium layer 191 helps control the eventual CoSi2 grain size and orientation by preventing the underlying cobalt to agglomerate, which is its natural tendency. The titanium essentially functions as a "guiding" layer in the sense that it helps direct CoSi2 grain orientation and size. Thus, the presence of a titanium-based layer (i.e., titanium or titanium nitride) is preferred even though titanium layer 191 is optional and if used, will be stripped later in the process.

Figure 21:
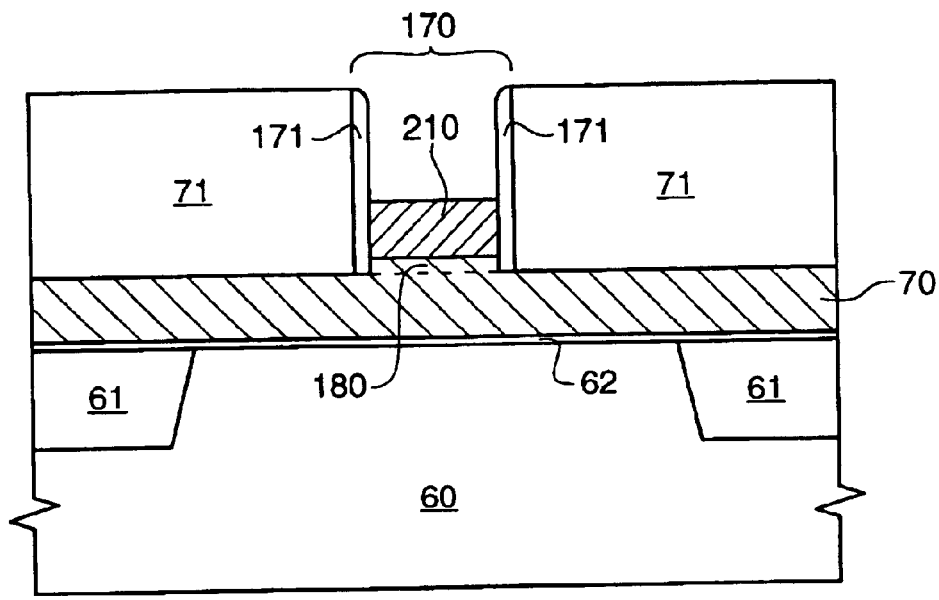
FIG. 21 is a subsequent cross-sectional view taken from FIG. 20 following the removal of any un-reacted metal layer and conductive layer and an optional second anneal step to continue the formation of metal silicide.

Referring now to FIG. 21, once the previous annealing step is completed, the un-reacted portions of cobalt 190 and titanium 191 are stripped from the semiconductor surface by Ammonia Peroxide Mixture (APM) or Hydrochloric Peroxide Mixture (HPM), thus leaving only $CoSi_2$ 200 and epi-Si 180 remaining in the trench.

The semiconductor assembly is then subjected to an optional second annealing step, preferably an RTP step at approximately 800–900° C. for approximately 30 to 60 seconds, to insure that the $CoSi_x$ 200, in contact with epi-Si 180 has indeed reacted with the underlying epi-Si to form a $CoSi_2$ layer 210 having a thickness of approximately 100–350 Angstroms. With epi-Si layer 180 having a thickness greater than the desired thickness of $CoSi_2$ layer 210, (which is the case in the present invention) the thickness of cobalt layer 190 determines the overall thickness of $CoSi_2$ layer 210. It is desired that after the formation of $CoSi_2$ layer 210, a portion of epi-Si 180 remains in the bottom of trench 170 and above the original surface of polysilicon layer 70 to ensure that no $CoSi_2$ encroaches into underlying polysilicon 70.

As mention in the first embodiment of the present invention, if the $CoSi_2$ were allowed to encroach into underlying polysilicon layer 70, as discussed in the prior art, the $CoSi_2$ will also form isotropically (in both the vertical and horizontal directions) and the width of the gate stack will grow outside the width of trench 170, making the feature size of the gate stack greater than the critical dimension constraint of the given process. This situation leads to loss of critical dimension control; as the $CoSi_2$ cannot be etched using a typical gate stack etch chemistry.

Figure 22:
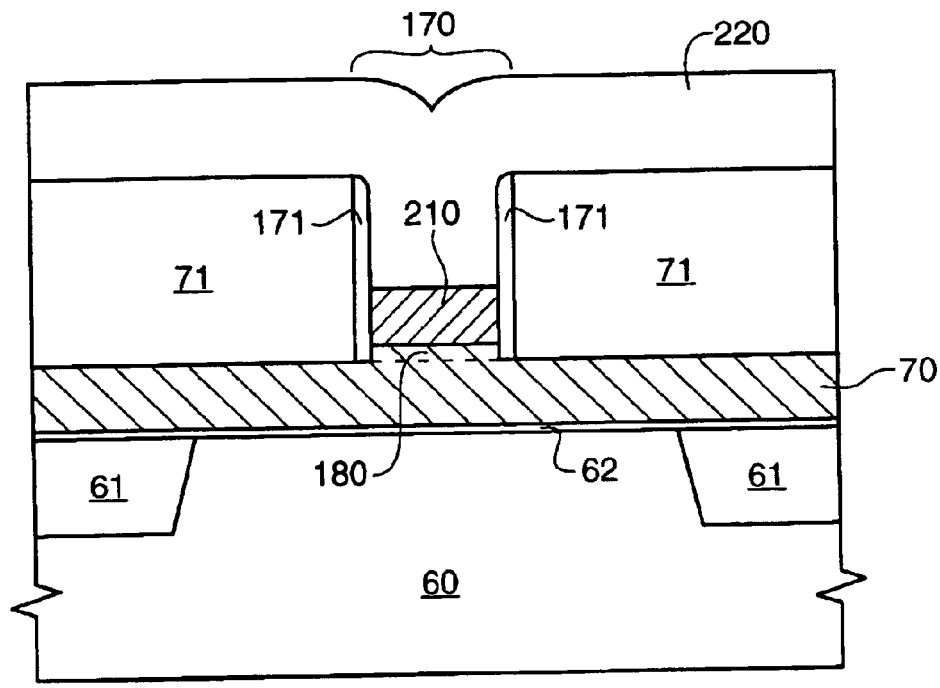
FIG. 22 is a subsequent cross-sectional view taken from FIG. 21 following the deposition of an isolation capping material for a transistor gate.

Referring now to FIG. 22, an isolation cap material 220, such as silicon nitride or silicon dioxide is deposited to completely fill the remaining area of trench 170. The type of isolation material deposited depends on the type of isolation material used for trench formation. In the present example, the trench isolation material used is silicon nitride, thus the isolation material 220 selected to fill the trench will be silicon dioxide, for a reason that becomes apparent in the following step.

Figure 23:
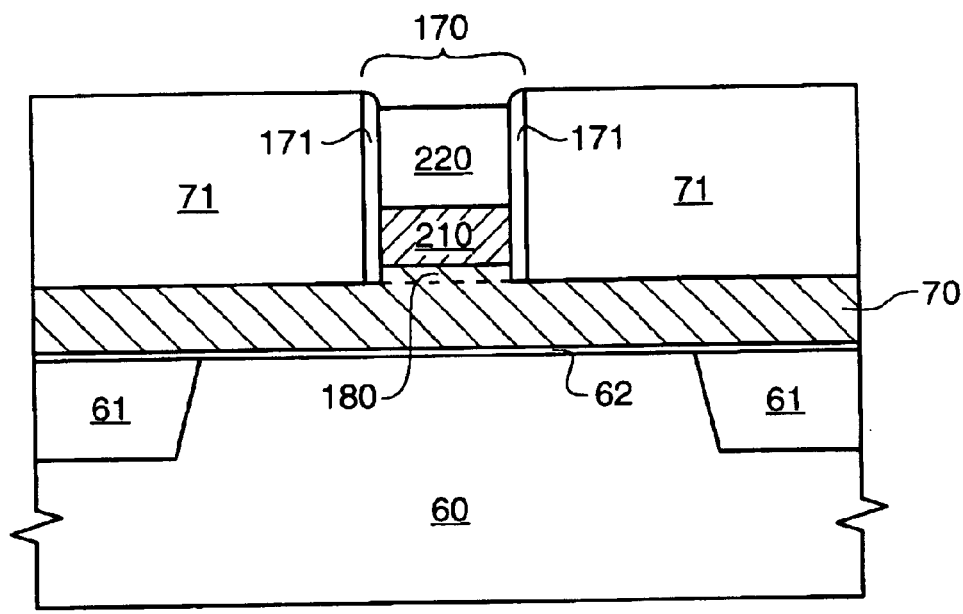
FIG. 23 is a subsequent cross-sectional view taken from FIG. 22 following a selective etch to remove the lateral component of the isolation capping material.

Referring now to FIG. 23, isolation cap material 220 (silicon dioxide) is etched back to remove the lateral component thereof, at or below the surface of trench isolation material 71 (silicon nitride). The etch is selective to silicon nitride 71, meaning the etch is stopped once it reaches silicon nitride 71. For example, a chemical-mechanical planarization etch may be utilized that will stop on silicon nitride 71.

Figure 24:
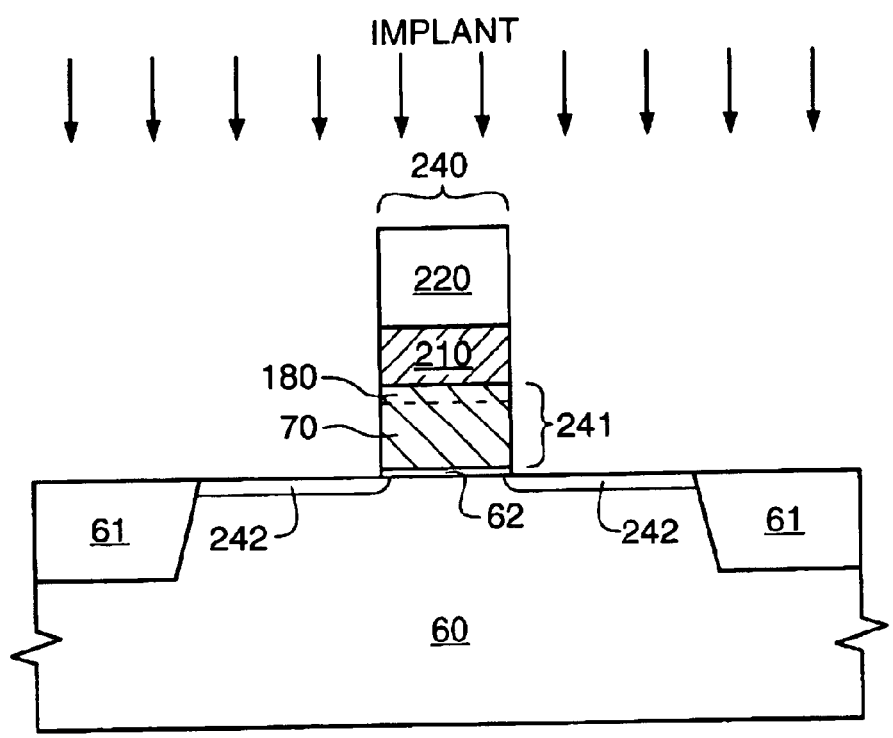
FIG. 24 is a subsequent cross-sectional view taken from FIG. 23 following an etch selective to the isolation capping material to form a transistor gate stack, which is then followed by a self-aligned implant to form lightly doped source/drain regions of the transistor.

Referring now to FIG. 24, an etch selective to isolation cap material 220 is performed that removes isolation trench material 71, the portion of polysilicon layer 70 and the portion of gate oxide layer that underlies isolation trench material 71, to form a transistor gate stack 240. The transistor stack material can be etched using only a dry etch or a combination of a wet etch to remove the trench material and a dry etch to remove the polysilicon and gate oxide. Transistor gate stack 240 comprises gate cap 220, CoSi2 portion 210, epi-Si portion 180 and polysilicon portion 70 (which combine to form silicon portion 241), and gate oxide portion 70. The presence and subsequent removal trench spacers 171 will in effect reduce the feature size of the transistor gate stack by thickness of trench spacers 171. Utilizing the trench spacers to fabricate a transistor gate stack will effectively allow for greater fabrication flexibility. After gate stack 240 is formed, a N-type implant is performed to form lightly doped self-aligned source/drain regions 242.

Figure 25:
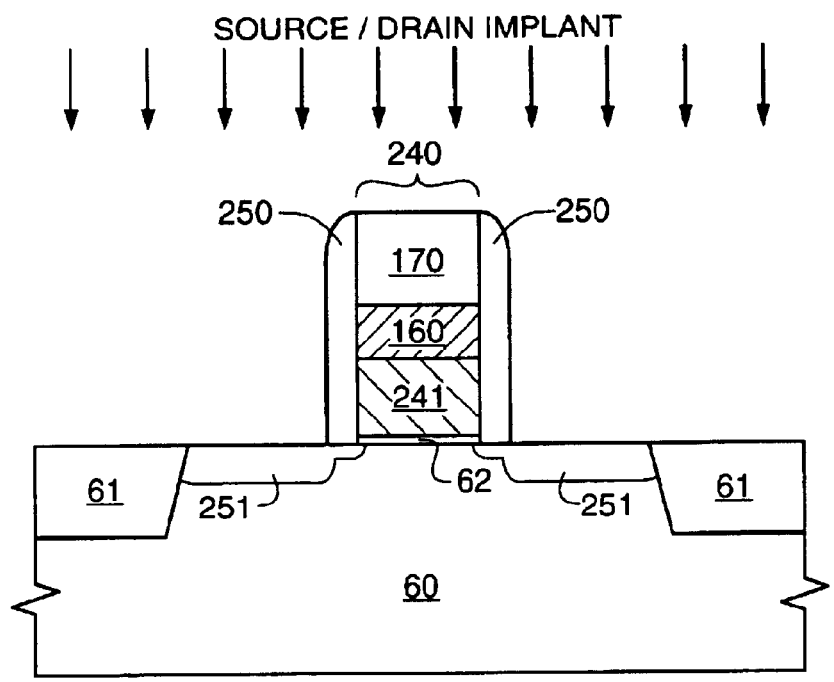
FIG. 25 is a subsequent cross-sectional view taken from FIG. 24 following the formation of transistor gate sidewall isolation spacers and a subsequent source/drain implant.

Referring now to FIG. 25, transistor gate spacers 250 are formed on the sidewalls of gate stack 240. Next, an N-type implant is performed to form source/drain regions 251. The semiconductor assembly is then completed with an appropriate fabrication process know to those skilled in the art.

Figure 26:
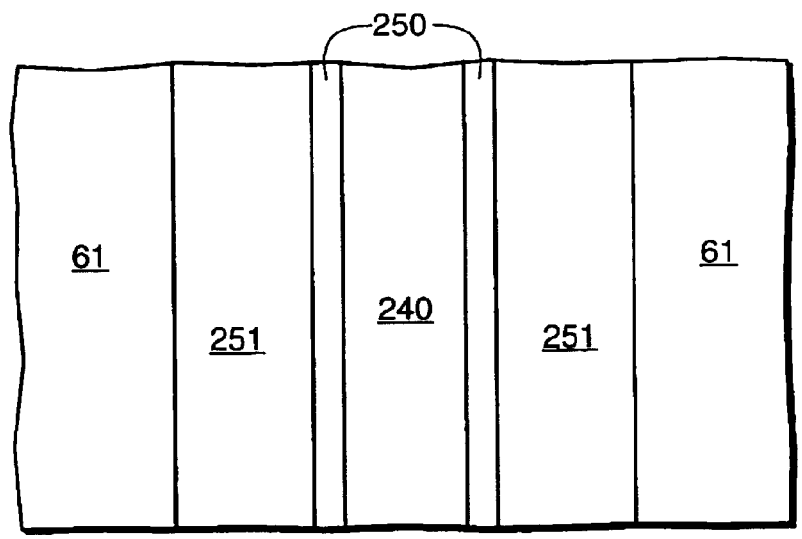
FIG. 26 is an overhead plan view of FIG. 25 showing a completed transistor having a metal silicide gate and an overlying integrated transistor isolation cap as fabricated in the second embodiment of the present invention.

FIG. 26 depicts an overhead view of a completed transistor structure of FIG. 25 having transistor gate stack 240, transistor gate spacers 250, source drain regions 251 and transistor trench isolation regions 61.

The exemplary embodiments have been discussed in reference to forming a transistor structure for use in semiconductor assemblies, such as memory devices. However, the concepts taught in the exemplary embodiments, may be utilized by one of ordinary skill in the art to form such transistor structures for use in most all semiconductor applications. For example, the present invention may be applied to a semiconductor system, such as the one depicted in FIG. 27, the general operation of which is known to one skilled in the art.

Figure 27:
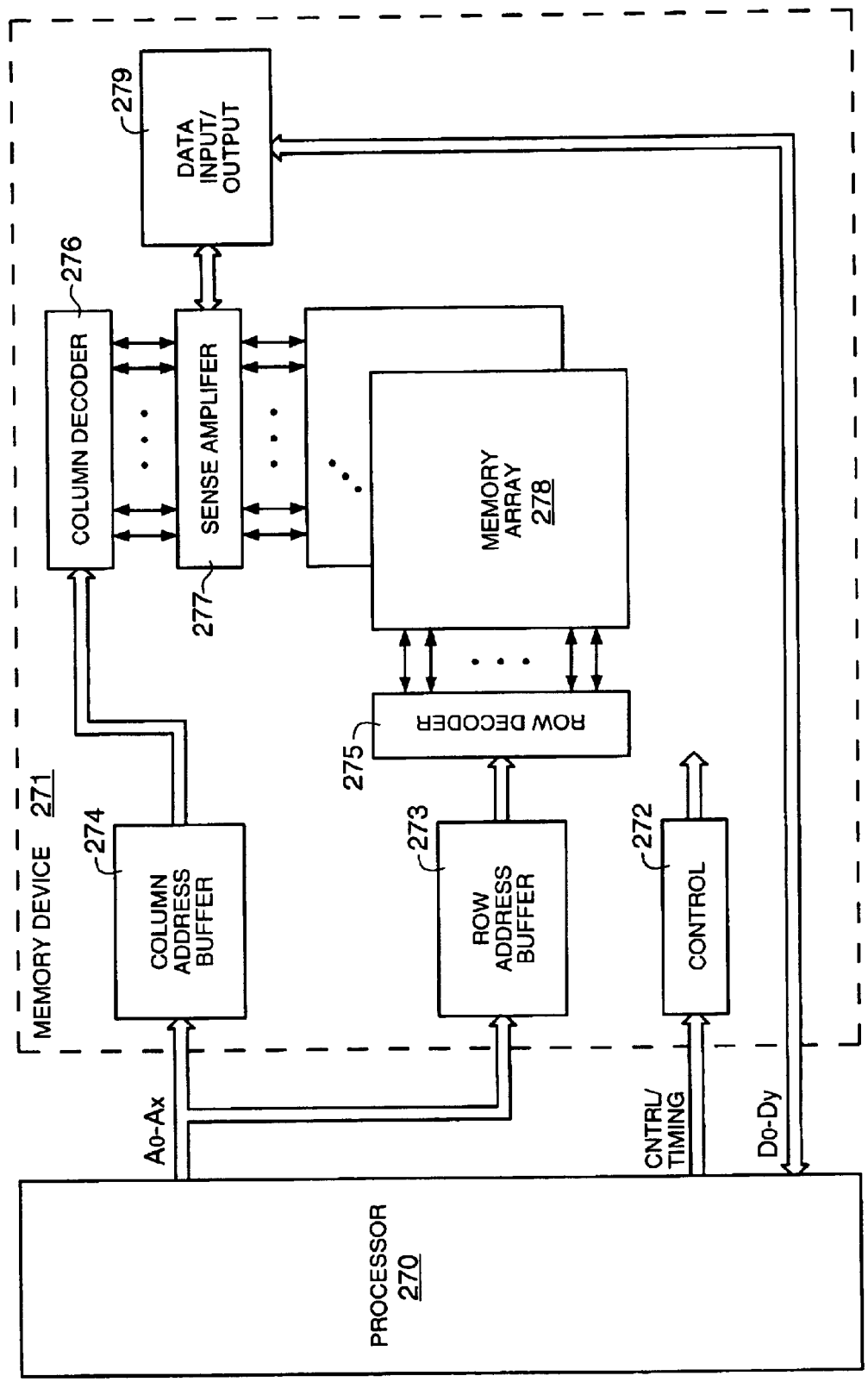
FIG. 27 is a simplified block diagram of a semiconductor system comprising a processor and memory device to which the present invention may be applied.

FIG. 27 represents a general block diagram of a semiconductor system comprising a processor 270 and a memory device 271 showing the basic sections of a memory integrated circuit, such as row and column address buffers, 273 and 274, row and column decoders, 275 and 276, sense amplifiers 277, memory array 278 and data input/output 279, which are manipulated by control/timing signals from the processor through control 272.

It is to be understood that, although the present invention has been described with reference to two exemplary embodiments, various modifications, known to those skilled in the art, may be made to the disclosed structure and process herein without departing from the invention as recited in the several claims appended hereto.

What is claimed is:

1. A method of forming a semiconductor memory device having a transistor comprising:
  providing a substrate having isolation regions formed into a conductive silicon substrate with an oxide layer formed thereon;
  forming a polysilicon layer on the oxide layer;
  forming a trench isolation material over the polysilicon layer;

forming a patterned photoresist having an opening therein over the trench isolation material;

etching a trench into the trench isolation material through the opening and exposing a portion of the underlying polysilicon layer;

growing epitaxial silicon into the bottom of the trench on the exposed portion of the underlying polysilicon layer;

depositing a metal layer along the sidewalls of the trench and on the epitaxial silicon;

performing a first anneal on the semiconductor assembly to cause the metal layer to react with the epitaxial silicon to form metal silicide;

removing any un-reacted metal layer;

performing a second anneal step to continue the formation of metal silicide;

depositing an isolation capping material into the trench and over the metal silicide;

removing the lateral component of the isolation capping material;

etching selectively to the isolation capping material to form a transistor gate stack comprising a transistor isolation cap, the metal silicide, a portion of the silicon layer and the transistor gate oxide;

implanting conductive dopants into the conductive silicon substrate to form self-aligned lightly doped source/drain regions of the transistor;

forming transistor gate sidewall isolation spacers; and implanting conductive dopants into the conductive silicon substrate to form source/drain regions of the transistor.

2. The method of claim 1, wherein the metal layer comprises cobalt or nickel.

3. The method of claim 1, further comprising:

prior to growing epitaxial silicon into the bottom of the trench, forming inner trench spacers on sidewalls of the trench isolation material formed by the trench.

4. The method of claim 3, further comprising:

removing the inner trench spacers during the removal the isolation capping material.

5. The method of claim 1, further comprising:

depositing a conductive layer on the metal layer to control metal silicide grain formation; and removing the conductive layer during the removing of any un-reacted metal silicide.

6. A method of forming a semiconductor assembly having a transistor comprising:

providing a substrate having isolation regions formed into a conductive silicon substrate with an oxide layer formed thereon;

forming a polysilicon layer on the oxide layer;

forming a trench isolation material over the polysilicon layer;

forming a patterned photoresist having an opening therein over the trench isolation material;

etching a trench into the trench isolation material through the opening and exposing a portion of the underlying polysilicon layer;

growing epitaxial silicon into the bottom of the trench on the exposed portion of the underlying polysilicon layer;

depositing a metal layer along the sidewalls of the trench and on the epitaxial silicon;

performing a first anneal on the semiconductor assembly to cause the metal layer to react with the epitaxial silicon to form metal silicide;

removing any un-reacted metal layer;

performing a second anneal step to continue the formation of metal silicide;

depositing an isolation capping material into the trench and over the metal silicide;

removing the lateral component of the isolation capping material;

etching selectively to the isolation capping material to form a transistor gate stack comprising a transistor isolation cap, the metal silicide, a portion of the silicon layer and the transistor gate oxide;

implanting conductive dopants into the conductive silicon substrate to form self-aligned lightly doped source/drain regions of the transistor;

forming transistor gate sidewall isolation spacers; and implanting conductive dopants into the conductive silicon substrate to form source/drain regions of the transistor.

7. The method of claim 6, wherein the metal layer comprises cobalt or nickel.

8. The method of claim 6, further comprising:

prior to growing epitaxial silicon into the bottom of the trench, forming inner trench spacers on sidewalls of the trench isolation material formed by the trench.

9. The method of claim 8, further comprising:

removing the inner trench spacers during the removal the isolation capping material.

10. The method of claim 6, further comprising:

depositing a conductive layer on the metal layer to control metal silicide grain formation; and removing the conductive layer during the removing of any un-reacted metal silicide.

11. A method of forming semiconductor system having a transistor comprising:

providing a substrate having isolation regions formed into a conductive silicon substrate with an oxide layer formed thereon;

forming a polysilicon layer on the oxide layer;

forming a trench isolation material over the polysilicon layer;

forming a patterned photoresist having an opening therein over the trench isolation material;

etching a trench into the trench isolation material through the opening and exposing a portion of the underlying polysilicon layer;

growing epitaxial silicon into the bottom of the trench on the exposed portion of the underlying polysilicon layer;

depositing a metal layer along the sidewalls of the trench and on the epitaxial silicon;

performing a first anneal on the semiconductor assembly to cause the metal layer to react with the epitaxial silicon to form metal silicide;

removing any un-reacted metal layer;

performing a second anneal step to continue the formation of metal silicide;

depositing an isolation capping material into the trench and over the metal silicide;

removing the lateral component of the isolation capping material;

etching selectively to the isolation capping material to form a transistor gate stack comprising a transistor isolation cap, the metal silicide, a portion of the silicon layer and the transistor gate oxide;

implanting conductive dopants into the conductive silicon substrate to form self-aligned lightly doped source/drain regions of the transistor;

forming transistor gate sidewall isolation spacers; and implanting conductive dopants into the conductive silicon substrate to form source/drain regions of the transistor.

12. The method of claim 11, wherein the metal layer comprises cobalt or nickel.

13. The method of claim 11, further comprising:

prior to growing epitaxial silicon into the bottom of the trench, forming inner trench spacers on sidewalls of the trench isolation material formed by the trench.

14. The method of claim 13, further comprising:

removing the inner trench spacers during the removal the isolation capping material.

15. The method of claim 11, further comprising:

depositing a conductive layer on the metal layer to control metal silicide grain formation; and removing the conductive layer during the removing of any un-reacted metal silicide.

16. A method of forming a transistor gate for a field effect transistor comprising:

providing a substrate having isolation regions formed into conductive silicon substrate with an oxide layer formed thereon;

forming a polysilicon layer on the oxide layer;

forming a trench isolation material over the polysilicon layer;

forming a patterned photoresist having an opening therein over the trench isolation material;

etching a trench into the trench isolation material through the opening to form trench sidewalls in the trench isolation material and to expose a portion of the underlying polysilicon layer;

growing epitaxial silicon having a thickness of approximately 400–500 Angstroms into the bottom of the trench and on the exposed portion of the underlying polysilicon layer;

depositing a cobalt layer along the sidewalls of the trench and on the epitaxial silicon;

depositing a titanium layer on the cobalt layer;

performing a first anneal on the semiconductor assembly at a temperature range of approximately 500–600° C., for approximately 30 to 60 to cause the metal layer to react with the epitaxial silicon to form cobalt sulicide;

removing of any un-reacted metal layer and cobalt layer;

performing a second anneal by subjecting the semiconductor assembly to a rapid thermal processing step at a temperature range of approximately 800–900° C. for approximately 30 to 60 seconds to further the formation of cobalt silicide such that the cobalt silicide is approximately 100–350 Angstroms in thickness but does not encroach the portion of the underlying polysilicon layer;

depositing an isolation capping material into the trench and over the cobalt silicide;

etching selectively to remove the lateral component of the isolation capping material;

etching selectively to the isolation capping material to form a transistor gate stack comprising a transistor isolation cap, the cobalt silicide, a portion of the polysilicon layer and the transistor gate oxide;

implanting conductive dopants to form self-aligned lightly doped source/drain regions of the transistor;

forming transistor gate sidewall isolation spacers; and implanting conductive dopants to form source/drain regions of transistor.

17. The method of claim 16, further comprising:

prior to growing epitaxial silicon into the bottom of the trench, forming inner trench spacers on sidewalls of the trench isolation material formed by the trench.

18. The method of claim 17, further comprising:

removing the inner trench spacers during the removal the isolation capping material.

* * * * *